(12) United States Patent
Roberts

(10) Patent No.: US 7,128,618 B1
(45) Date of Patent: Oct. 31, 2006

(54) CONNECTOR CHECK FIXTURE

(75) Inventor: James Dickinson Roberts, Royal Oak, MI (US)

(73) Assignee: Yazaki North America, Inc., Canton, MI (US)

( * ) Notice: Subject to any disclaimer, the term of this patent is extended or adjusted under 35 U.S.C. 154(b) by 0 days.

(21) Appl. No.: 11/148,715

(22) Filed: Jun. 9, 2005

(51) Int. Cl.
*H01R 13/24* (2006.01)

(52) U.S. Cl. .................................... 439/700

(58) Field of Classification Search ............. 439/66, 439/700, 680, 489, 310; 324/538
See application file for complete search history.

(56) References Cited

U.S. PATENT DOCUMENTS

| | | | |
|---|---|---|---|
| 2,968,019 A * | 1/1961 | Steinman et al. ........... | 439/633 |
| 5,670,884 A | 9/1997 | Kodama ..................... | 324/538 |
| 5,694,043 A | 12/1997 | Kodama ..................... | 324/538 |
| 5,831,438 A | 11/1998 | Okura ........................ | 324/538 |
| 6,081,124 A | 6/2000 | Chliyoda .................... | 324/538 |
| 6,116,935 A * | 9/2000 | Fukuda ....................... | 439/310 |
| 6,124,716 A | 9/2000 | Kanamori ................... | 324/538 |

* cited by examiner

Primary Examiner—Phuong Dinh
(74) Attorney, Agent, or Firm—Young & Basile, P.C.

(57) ABSTRACT

A check fixture for electrical connectors, including a pin nest made of a rigid plastic such as Delrin, having parallel slots and bores contiguous with said slots formed therein to receive one piece contact pins in precise arrangements and orientations to fit a connector to be checked. The contact pins are spring biased into the bores with blade portions extending outwardly from the slots. Wires are soldered into the butt ends of the contact pins and run to a conventional indicator. The pin nest is held within an outer body having a keyed opening to accept the connector in the proper orientation to be checked.

9 Claims, 4 Drawing Sheets

CONNECTOR CHECK FIXTURE

FIELD OF THE INVENTION

This invention relates to devices for checking the electrical continuity of electrical connectors and more particularly to an improved contact pin mounting and alignment structure which maintains contact pin alignment and reduces fixture manufacturing costs.

BACKGROUND OF THE INVENTION

Electrical connectors are checked for electrical continuity through the use of a check fixture which places the terminal openings in an end surface of the connector in alignment with a set of contact pins, called "POGO" pins, which are held in a pin nest. The geometric arrangement of pins in the nest matches the geometric arrangement of terminal openings in the end surface of the connector. A typical check fixture is provided with a lever which can be rotated to urge the connector toward the contact pin nest or vice versa such that the contact pins make electrical contact with internal terminals in the connector. If all of the terminals are properly in place and properly wired, electrical continuity is established through the connector and contact pins to an indicator which passes or fails the connector according to the results of the test. A fixture of this type is described in U.S. Pat. No. 5,649,043 issued Dec. 2, 1997 to Yazaki Corporation of Tokyo, Japan, the disclosure of which is incorporated herein by reference.

It is difficult and expensive to manufacture the prior art pin nests and to arrange the "POGO" pins as contact members in the pin nests so as to properly align with the arrangement of terminal openings in the connector under test. The POGO pins, in addition to being expensive components in and of themselves, create additional electrical contact interfaces in the check fixture which add to electrical losses and can result in false indications of missing terminals.

SUMMARY OF THE INVENTION

The present invention provides an improved and simplified pin nest comprising the combination of a solid body of rigid, nonconducting material such as "Delrin" which is modified to receive one piece contact pins and hold those contact pins in a geometric arrangement which corresponds to the arrangement of terminal openings in a connector under test and in an orientation which befits the test. In general, the pin nest of the present invention comprises a body of nonconductive material such as Delrin having opposite end surfaces. Cylindrical bores are formed in the body from one of the end surfaces in an arrangement which corresponds to the arrangement of terminal openings in a connector to be tested. The bores extend only part way through the body. Slots are cut into the other end so as to intercept linearly arrayed groups of bores. If, for example, four bores are spaced in a square pattern, two parallel slots are cut across two groups of two bores each. If nine bores are grouped in a 3×3 arrangement, three slots are required, and so forth.

The contact pins which are placed in the bores have cylindrical portions which fit into the bores and integral blade portions which fit precisely into the slots which extend the bores through the body. A shoulder on each contact pin at the transition between the cylindrical and blade-shaped portions abuts the inner end of the bore where the bore opens into the slot. The blade portion of the pins is longer than the slots are deep, so a portion of the blade extends from the body. Springs are used to resiliently bias the contact pins into the bores and slots so as to permit some longitudinal recession of the contact pins during a check operation. Wires are soldered into the butt ends of the contact pins and extend through threaded caps which hold the springs and contact pins into the pin nest body. The soldered-in wires run to an indicator or diagnostic device such as a microprocessor in conventional fashion. Soldering is mentioned by way of example as other wire-connecting methods may be used.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION OF AN ILLUSTRATIVE EMBODIMENT

Figure 1:
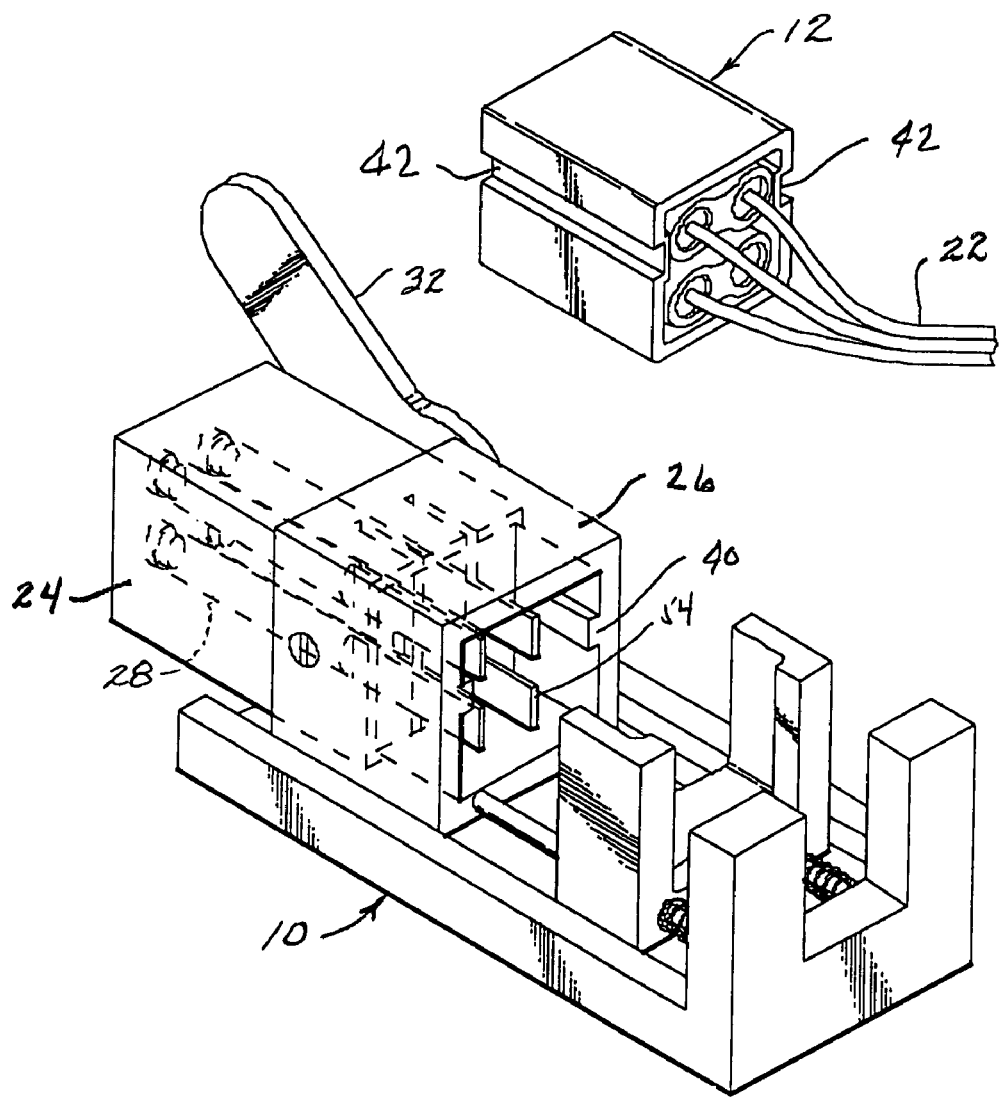
FIG. 1 is a perspective view of a connector test fixture showing a pin nest in place in the fixture.
Figure 2:
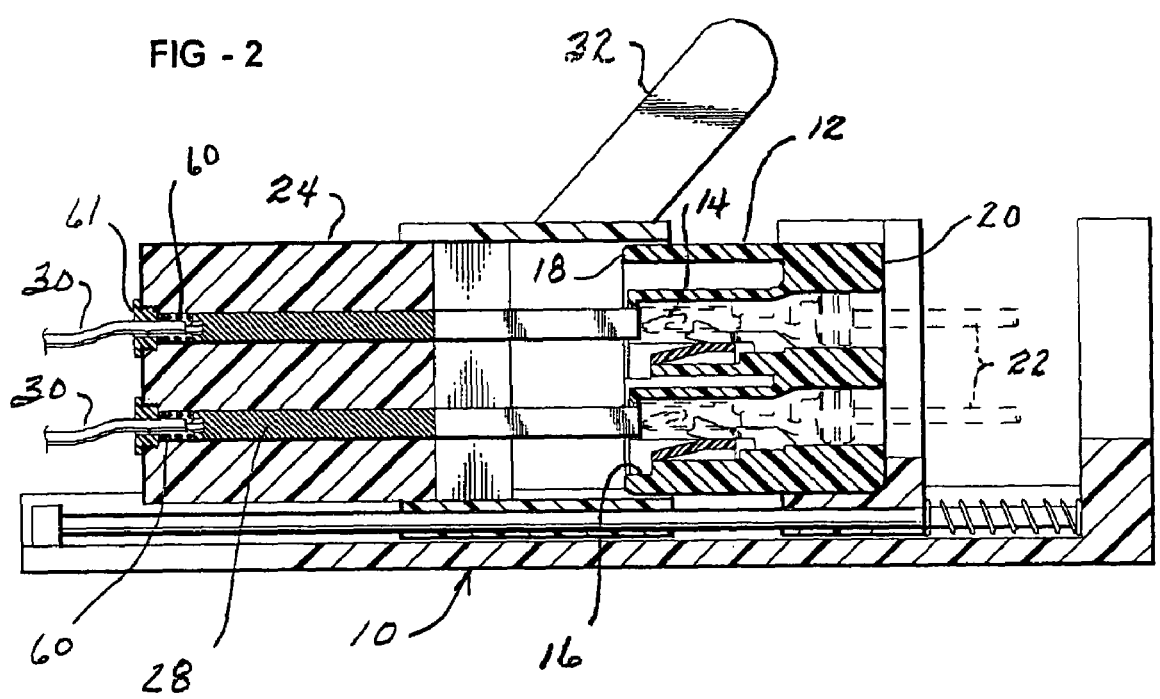
FIG. 2 is a side view of the fixture and pin nest in section.
Figure 3:
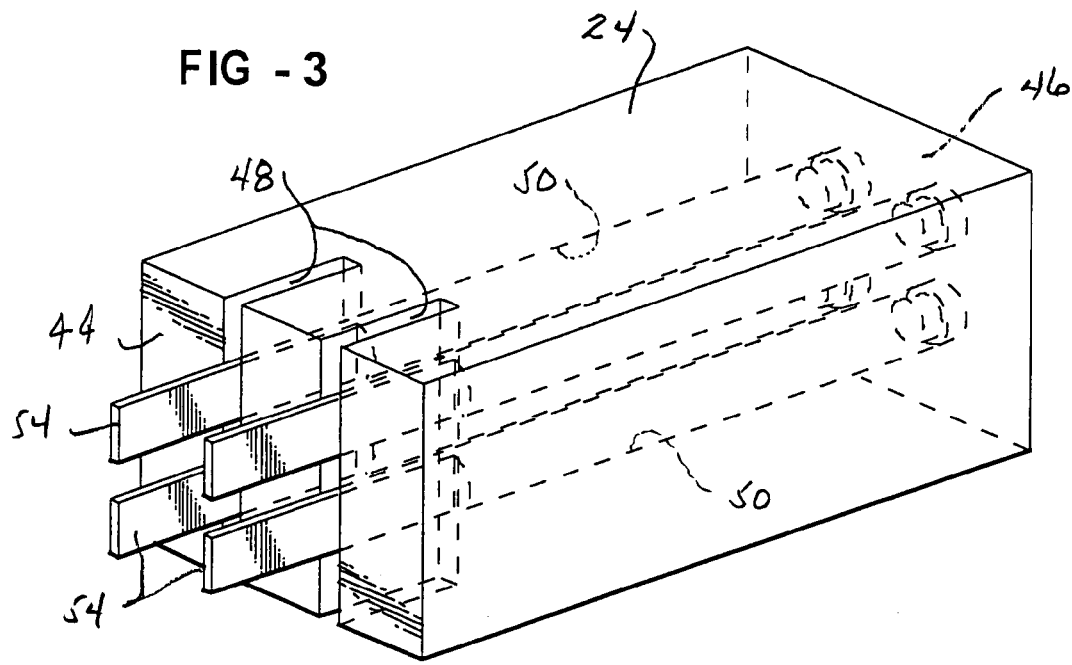
FIG. 3 is a perspective view of the pin nest.
Figure 4:
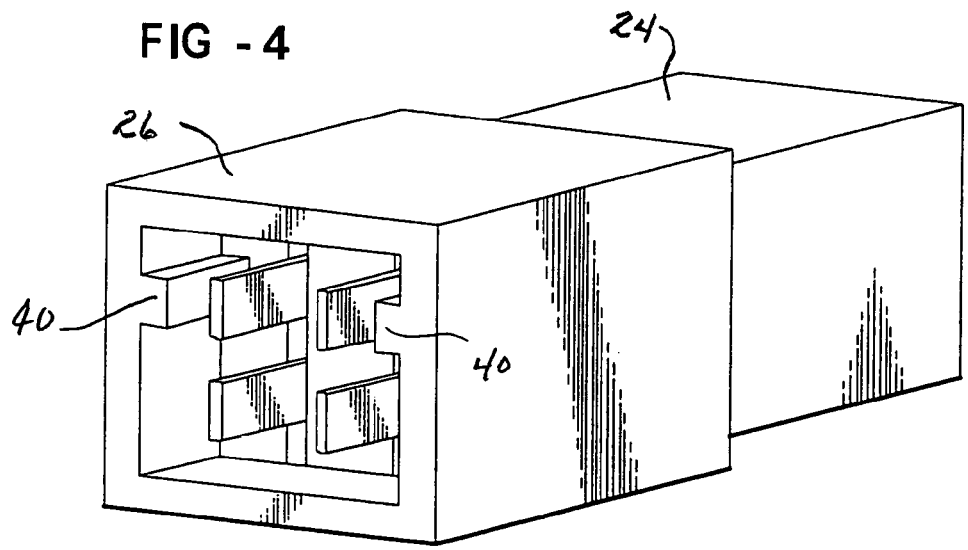
FIG. 4 is a perspective view of the pin nest in an outer housing.

Referring to FIGS. 1 and 2, there is shown a fixture 10 for testing a connector 12 having a 2×2 arrangement of metal terminals 14 in longitudinal channels 16 extending through the connector body between the opposite end surfaces 18 and 20 thereof. Terminals 14 are connected to wires 22 which may form part of a wiring harness (not shown).

In this particular connector, the arrangement of terminals is 2×2; i.e., two rows of two terminals each. This is merely for illustration as many other arrangements and total numbers of terminals are in common usage.

Fixture 10 receives a pin nest 24 mounted in a holder 26 which fits into the fixture 10. The pin nest holds a 2×2 arrangement of contact pins 28, the geometry of the arrangement corresponding exactly to the geometry of the channels 16 and terminals 14 in connector 12. Again, this is merely illustrative. The pins 28 are connected to wires 30 which may be connected to an indicator or diagnostic system (not shown).

The fixture 10 includes a lever 32 which can be moved from the FIG. 1 position to the FIG. 2 position to bring the pin nest 24 and holder 26 into engagement with the connector 12 to carry out an electrical continuity test on the four circuits defined by the terminals 14 and wires 22. The test, as shown in FIG. 2, involves bringing the ends of the pins 28 into contact with the ends of the terminals 14. If a terminal is missing or defective or incorrectly located, electrical continuity for that circuit will not exist and the diagnostic system will so detect. A bad connector will in this fashion be rejected. The invention doesn't require the specific fixture 10 for use. For example, the pin nest 24 and holder 26 could be mounted on a base such that they could be pivoted to a first position to receive the connector 12 and then pivoted to a second position where the connector is held in place for testing by a shoulder of the base. Alternatively, the pin nest and holder could be fixed in position on a base and a movable latch attached to the base could be used to retain the connector in position for testing.

The pin nest 24, holder 26, pins 28 and associated structure will now be described in greater detail.

Referring now to FIGS. 2–7, pin nest 24 takes the form of a rectangular block of rigid plastic such as Delrin, carrying a precisely geometrically arranged plurality of solid metal contact pins 28. The pin nest is snugly fit within the interior volume of the outer body holder 26, also manufactured of Delrin. The pin nest 24 is essentially square in cross section and, therefore fits into the square cross-section opening in the holder 26. Keys 40 are formed on the opposite side interior surfaces of the holder 26 to perform two functions; first, the keys 40 serve as stops to locate the pin nest 24 within the holder 26; second, they cooperate with keyways 42 in the connector 12 to assure bringing the connector 12 and pin nest 24 together in fixture 10 in the correct orientation. These index features can be configured to fit any square or rectangular connector design.

The pin nest has opposite parallel end surfaces 44 and 46. Slots 48 are saw cut into the end surface 44 for approximately one-third of the depth of the pin nest block 24. The slots 48 are parallel and correspond to the number and spacing of rows of pins 28, which in turn corresponds to the number and spacing of rows of terminals 14 in connector 12. In this case, two slots 48 are shown with the understanding that this is purely for purposes of illustration.

Cylindrical bores 50 are formed in the pin nest body 24 from the back end 46 and extend through the body 24 until they are contiguous with and open into the slots 48. The arrangement of the parallel, cylindrical bores 50 mirrors that of the arrangement of terminals 14 in the connector to be checked. The order in which the slots and bores are formed is arbitrary, i.e., the bores 50 may be drilled before or after the slots are cut. The bore depth, however, is more critical since it determines the location of the pins 28 as hereinafter described.

Figure 5:
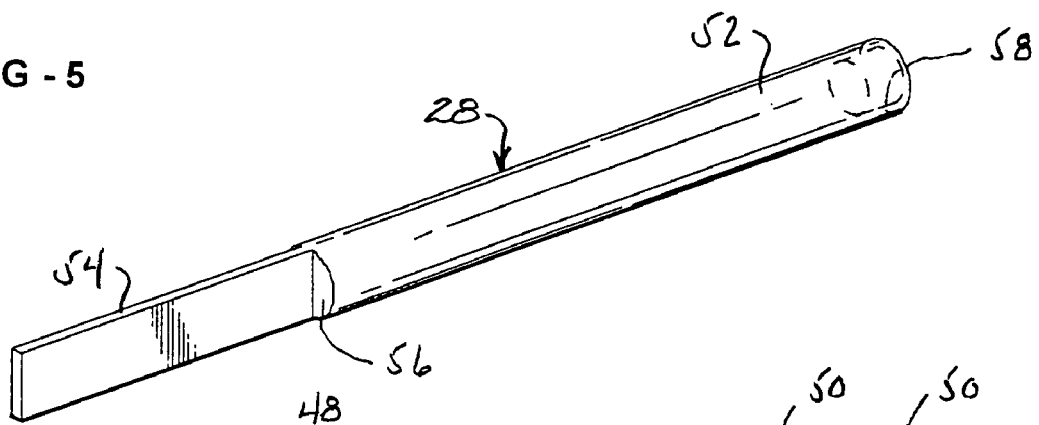
FIG. 5 is a perspective drawing of a contact pin.
Figure 6:
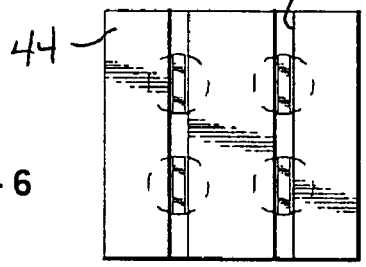
FIG. 6 is an end view of the pin nest.
Figure 7:
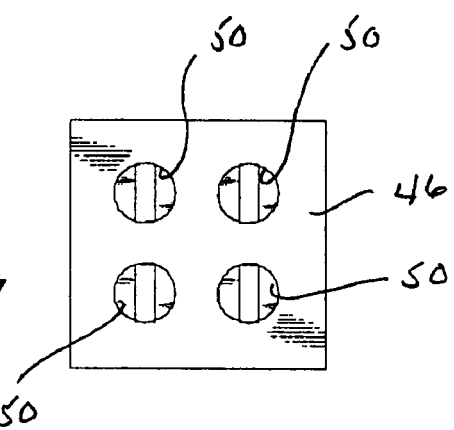
FIG. 7 is an opposite end view of the pin nest.

Contact pins 28 of stainless steel, solid copper or other suitable metal have first lengthwise cylindrical portions 52 and second lengthwise blade portions 54 of approximately equal length. The blade portions 54 are integral with and diametrically oriented relative to the cylindrical portions 52 as shown. The contact pins 28 are inserted into the bores 50 until the blade portions 54 reach the slots 48. At this point, the contact pins 28 must be rotated until they are in the proper orientation so that the flat blade portion 54 aligns with the slots 48 and permits the contact pins to be fully inserted into the bores 50. As shown in FIG. 5, the interface between the cylindrical pin body 52 and the blade 54 forms a shoulder 56 which abuts the end of the bore 50 to provide a mechanical stop for the pin 28. The length of the blade 54 is such that approximately one-half of the length of the blade protrudes from the end 44 of the pin nest 24 and into the cavity which receives the connector 12. However, the cylindrical portion 52 of the pin 28 could be longer than the blade portion 54 to provide additional bearing surface area if needed. It is also possible to make the blade portion 54 shorter than the depth of the slot 48 so it is recessed within the end 44 of the pin nest 24. The slot could then receive an end portion of a male terminal for testing. The male terminal, for example, could touch the pin 28 in mid-slot.

The pins 28 are each formed with counter-bores 58 in the butt ends of the kind to receive the wires 30 and a quantity of solder as shown in FIG. 2. Springs 60 are then inserted into the bore against the butt ends of the contact pins 28 and threaded caps 61 are threaded into the nest 24 to hold the longitudinal arrangements in place. The springs 60 permit "give" in the contact pins 28 when a connector is being checked. The pins function as spring-loaded plungers to make up for tolerance stack ups. The springs apply sufficient force to the pins so they can make good contact with the terminals being tested. The wires 30 run to a conventional diagnostic system or indicator set as mentioned above.

As indicated above, the bores and slots in the pin nest body are easily formed using conventional cutting and boring techniques and tools. The depth of the bores is critical since it determines the depth to which each pin 28 extends into the nest 24. The slot depth is less critical, i.e., it must be deep enough to intercept the bores, but it could be somewhat over cut without negative result. The solid, one-piece contact pins 28 eliminate the need for the more expensive and complicated POGO pins, whereas the slots 48 which snugly receive the blade portion 54 of the contact pins ensure the maintenance of proper orientation and alignment of the contact pins. The pin nest 24 may be easily removed from a check fixture and replaced with another pin nest in which the bores and slots are arranged geometrically for a different type of connector.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A contact pin nest for use in a connector check fixture comprising:
    a body of rigid, nonconductive material having first and second opposite end surfaces;
    a group of parallel bores formed part way through the body from one of said end surfaces;
    at least one slot formed in the body from the other end surface, said slot extending into the body far enough to intercept at least some of said bores; and
    a solid, conductive contact pin having a first lengthwise cylindrical portion disposed in one of said bores and a second integral lengthwise blade portion diametrically oriented relative to the cylindrical portion and disposed in said slot, the slot being formed to maintain alignment of the blade portion.

2. A pin nest is described in claim 1 further comprising an outer body having an internal volume of such size and shape as to receive and hold said pin nest and having an opening adapted to receive a connector to be brought into engagement with said contact pin.

3. A contact pin nest for use in a connector check fixture comprising:
    a body of rigid, nonconductive material having first and second opposite end surfaces;
    a group of parallel bores formed part way through the body from one of said end surfaces;
    at least one slot formed in the body from the other end surface, said slot extending into the body far enough to intercept at least some of said bores; and
        a solid, conductive contact pin having a cylindrical portion disposed in one of said bores and a blade portion disposed in said slot; the slot being formed to maintain alignment of the blade portion;

said pin nest further comprising an outer body having an internal volume of such size and shave as to receive and hold said pin nest and having an opening adapted to receive a connector to be brought into engagement with said contact pin;

wherein the outer body is keyed to accept a connector only in a predetermined orientation.

4. The pin nest of claim 1 wherein the blade portion is longer than the depth of the slot so as to extend outwardly from the other end surface.

5. For use in a check fixture for a connector having a geometrically specific arrangement of terminal openings formed therein and spaces for terminals within said openings, a contact pin nest comprising:
 a body of rigid, nonconductive material having first and second opposite end surfaces;
 a plurality of parallel bores extending part way through said body from one of said end surfaces; the arrangement of said bores corresponding to said arrangement of terminal openings;
 a plurality of parallel slots formed in the body across the other end surface, each said slot intercepting a linear grouping of bores; and
 a plurality of contact pins having cylindrical portions disposed in said bores and blade portions disposed in said slots, said blade portions being longer than a depth of the slot so as to extend outwardly from said other end surface.

6. A pin nest as described in claim 5 further including an outer body adapted to receive said pin nest and having an opening formed therein to receive a connector through said opening and into contact with said contact pins.

7. A combination as defined in claim 6 wherein said outer body is keyed to accept the connector only in a predetermined orientation.

8. A combination as defined in claim 6 further including spring means disposed in said pin nest body for resiliently urging said contact pins fully into said cylindrical bores, but resiliently permitting a degree of displacement of said pins relative to said body.

9. The combination as defined in claim 8 further including conductor means connecting said contact pins to an external device.

* * * * *